United States Patent
Lueck

(10) Patent No.: US 8,045,315 B2
(45) Date of Patent: Oct. 25, 2011

(54) ELECTRONIC DEVICE WITH ION COOLING SYSTEM

(75) Inventor: Thomas Lueck, Augsburg (DE)

(73) Assignee: Fujitsu Technology Solutions Intellectual Property GmbH, Munich (DE)

( * ) Notice: Subject to any disclaimer, the term of this patent is extended or adjusted under 35 U.S.C. 154(b) by 0 days.

(21) Appl. No.: 12/838,110

(22) Filed: Jul. 16, 2010

(65) Prior Publication Data

US 2010/0277844 A1 Nov. 4, 2010

Related U.S. Application Data

(63) Continuation of application No. PCT/EP2009/051728, filed on Feb. 13, 2009.

(30) Foreign Application Priority Data

Feb. 25, 2008 (DE) .................. 10 2008 010 944

(51) Int. Cl.
*H01T 23/00* (2006.01)
(52) U.S. Cl. ....................................... 361/231
(58) Field of Classification Search .............. 361/231
See application file for complete search history.

(56) References Cited

U.S. PATENT DOCUMENTS

| | | | |
|---|---|---|---|
| 4,953,407 A * | 9/1990 | Malaczynski et al. | 73/861.09 |
| 5,883,934 A | 3/1999 | Umeda | |
| 6,222,368 B1 * | 4/2001 | Inagaki et al. | 324/399 |
| 6,522,536 B2 | 2/2003 | Brewer et al. | |
| 7,407,293 B2 | 8/2008 | Ishii et al. | |
| 2002/0126448 A1 | 9/2002 | Brewer et al. | |
| 2005/0007726 A1* | 1/2005 | Schlitz et al. | 361/330 |
| 2005/0194543 A1* | 9/2005 | Hieke | 250/400 |
| 2006/0017889 A1 | 1/2006 | Ishii et al. | |
| 2006/0169441 A1* | 8/2006 | Schlitz | 165/121 |
| 2010/0277844 A1* | 11/2010 | Lueck | 361/78 |

FOREIGN PATENT DOCUMENTS

| | | |
|---|---|---|
| DE | 34 34 542 A1 | 4/1986 |
| EP | 1 571 489 A1 | 9/2005 |
| JP | 2001-343360 A | 12/2001 |
| WO | WO 94/12282 | 6/1994 |
| WO | WO 2007/112763 A1 | 10/2007 |

* cited by examiner

*Primary Examiner* — Ronald W Leja
(74) *Attorney, Agent, or Firm* — Slater & Matsil, L.L.P.

(57) ABSTRACT

An electronic device includes an ion cooling system for cooling system components of the device. Through an arrangement, ionization of an air flow caused by the ion cooling can be determined and the electrostatic charge on the components that are located within the air flow can be measured.

20 Claims, 3 Drawing Sheets

PRIOR ART

ELECTRONIC DEVICE WITH ION COOLING SYSTEM

This application is a continuation of co-pending International Application No. PCT/EP2009/051728, filed Feb. 13, 2009, which designated the United States and was not published in English, and which claims priority to German Application No. 10 2008 010 944.4 filed Feb. 25, 2008, both of which applications are incorporated herein by reference.

TECHNICAL FIELD

The invention relates to an electronic device with an ion cooling system for cooling the system components of the device and also a method for monitoring an electrostatic charge on components of the electronic device, with this electrostatic charge being caused by an ion cooling system.

BACKGROUND

The cooling of system components plays an important role in electronic devices, such as, for example, a computer system. Through the cooling, overheating of the components is prevented and thus the functionality of the individual components and interruption-free operation of the device is guaranteed.

As a rule, the cooling of the system components, such as, for example, of a CPU or a power-supply unit in a computer system, is performed by a cooling system made from one or more fan ventilators. By means of the ventilators, an air flow is generated through which the components of the device are cooled and the heated air is transported out of the device.

Likewise, a so-called ion cooling for electronic devices is known. For ion cooling, as a rule, an ion cooling system is integrated into the system in which the conventional ventilators are replaced by an element that generates an air flow.

The cooling system is made, for example, from one or more ion coolers that have two grounded grids between which an arrangement of wires is located that are at a high positive and negative voltage. Ambient air molecules are ionized on the electrodes by the high voltage that is applied. The positively charged ions move in the voltage drop to the negatively charged cathodes and collide on the way with additional air molecules. In this way, an ion flow is generated. This ion flow generates an air flow due to the collisions with neutral air molecules on the surface of the components of the electronic device and thus provides cooling of the components. The grounded grids are provided to discharge the generated ions on them as completely as possible and in this way to free the air from ions again to a large extent.

The disadvantage in cooling an electronic device by means of an ion cooling system is that, despite the discharging of ions by the grounded grids, the air flow cooling the components can have a defined degree of ionization by means of which the electronic components can be charged and also damaged. In particular, an ion cooling system that is not functioning optimally or that is not set optimally can result, in some areas, in an ionization of the air flow that is too strong, which can have a strong negative effect on an interrupt-free operation of the electronic device.

The effect of the ionized air flow on the components can also depend on the ambient properties of the device, such as, for example, the air humidity or the dust concentration in the air within the device.

Due to the electrostatic charging of the components caused by the ionization of the air flow, critical voltages that can lead to the breakdown of individual components or the device itself can result.

SUMMARY

In one aspect, the invention describes an electronic device with an ion cooling system in which an electrostatic charging of the components of the device can be controlled, wherein this electrostatic charging is generated by the ion cooling. For example, an electronic device of the type named above can be characterized in that at least one arrangement is installed in the device through which the ionization of the air flow can be defined.

By defining the ionization of the air flow, on one hand, the degree of ionization of the cooling air flow and its effects on the components of the device located in the air flow—that is, their electrostatic charge—is controlled, but, on the other hand, the functioning of the complete ion cooling system is also tested, without the electronic device having to be turned off or opened or even requiring a disassembly of the cooling system.

In one preferred construction of the invention, for defining the ionization of the air flow, a measurement of the charge transferred to at least one electrode by the ionization is provided.

Another construction of the invention provides a measurement of the current flowing from the at least one electrode for the determination of the ionization.

A preferred construction provides that the at least one electrode is a cooling body of a system component of the device.

Another preferred construction of the invention provides that the at least one electrode is a conductive surface of a system component of the electronic device located in the ionized air flow.

In a similarly preferred construction, the at least one electrode is a dummy component that is installed in the device and that is located in the ionized air flow.

A preferred construction of the invention provides that, for the determination of the ionization of the air flow, the at least one arrangement has a device with which the current flowing from the at least one electrode can be determined, as well as that the at least one arrangement connects the at least one electrode to a ground potential.

In another preferred construction, the at least one arrangement for the determination of the ionization also has a switching element with which the connection between the at least one electrode and the ground potential can be established or broken. In this way, an electrostatic charge on the at least one electrode, with this charge building up over a long time period, can also be achieved, for example, for testing purposes. It is similarly possible to generate a detectable signal despite an only minimal ionization of the air flow.

BRIEF DESCRIPTION OF THE DRAWINGS

The invention will be explained in detail below using embodiments with reference to the drawings. The drawings include.

The following list of reference symbols can be used in conjunction with the drawings:

| | |
|---|---|
| 1 | Computer system |
| 2 | Power supply unit |
| 3 | CPU |
| 4 | Drives |
| 5 | Fixed disk |
| 6 | System components |
| 7 | Ion cooling system |
| 8 | Ionized air flow |
| 9 | Components |
| 10 | Dummy component |
| 11 | Ground potential |
| 12 | Device |
| 13 | Resistor |

DETAILED DESCRIPTION OF ILLUSTRATIVE EMBODIMENTS

Figure 2:
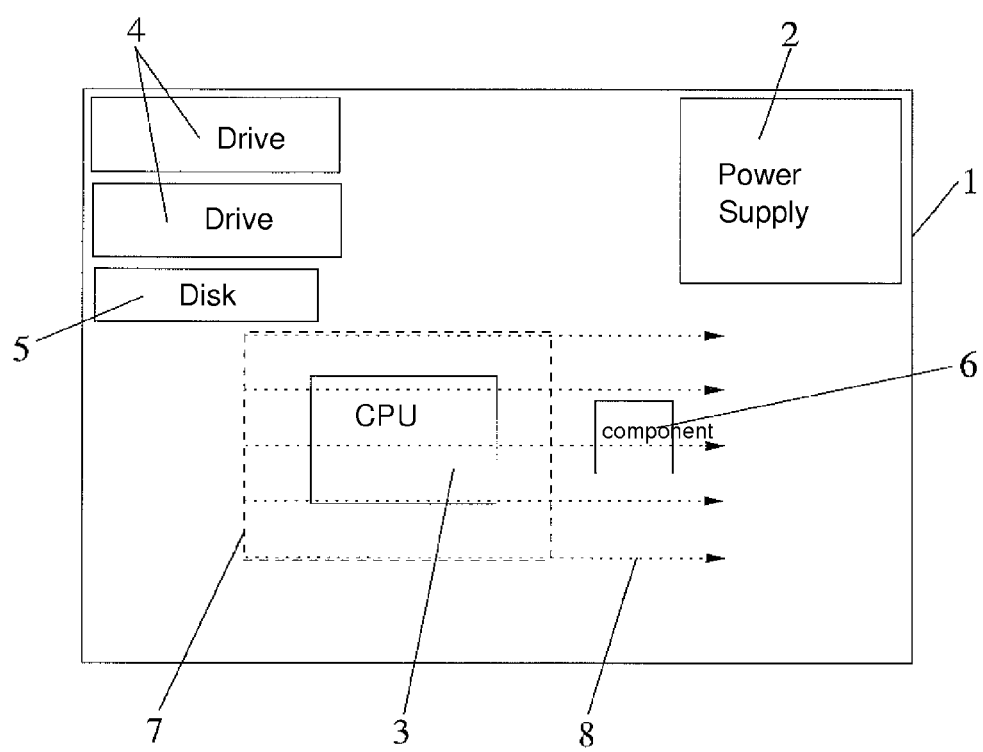

FIG. 2 shows an arrangement made from a computer system 1 that has a power supply unit 2, a CPU 3, two drives 4, and a fixed disk 5. The computer system 1 further contains a system component 6 as well as an ion cooling system 7 for cooling components of the computer system 1 through ion cooling according to the prior art, as usually realized in a computer system 1. The system 1 can be, for example, a desktop personal computer (PC), a notebook, or also a server. Through ion cooling, an air flow 8 is generated through which the components of the computer system 1 located within the air flow 8, such as, in this embodiment, the CPU 3 and the system component 6, are cooled at the surface.

A malfunction of the cooling system 7 can lead (in addition to the unavoidable residual ionization of the air flow 8) to an ionization of the air flow 8 that is too strong. This has the consequence that the components located in the air flow 8, in this case, the CPU 3 or the component 6, are charged by the ionized air flow 8 unnoticed to a value that is critical for the computer system 1, which can lead to failure of the CPU 3 or the component 6 and as a consequence of this to a breakdown in the operation of the computer system 1.

Figure 1:
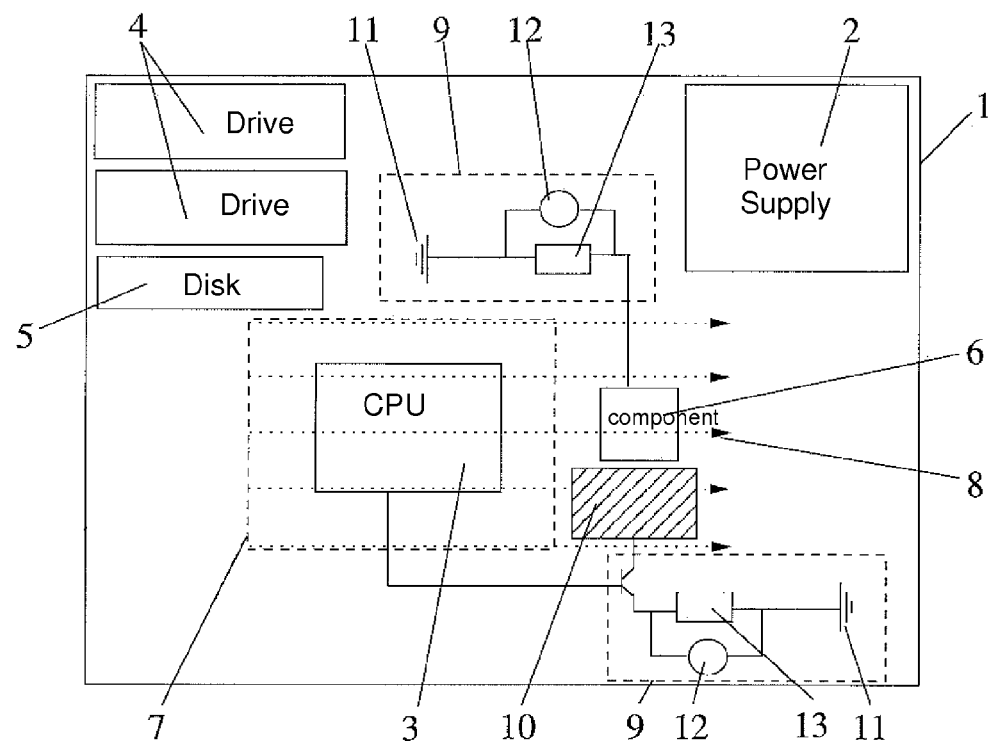
FIG. 1, which provides a schematic diagram of a computer system with a power supply unit, a CPU, drives, a fixed disk, an ion cooling system, and system components provided in the interior and located in the air flow of the ion cooling, as well as arrangements for the measurement of the ionization of the air flow, FIG. 2, which provides a schematic diagram of the computer system from FIG. 1 with an ion cooling system according to the state of the art, FIG. 3, which provides a flow chart for a method for monitoring the electrostatic charge on a component of an electronic device located in the ionized air flow.

FIG. 1 shows the computer system 1 shown in FIG. 2 with the system components (2-6) described above as well as the ion cooling system 7 and the air flow 8 generated by the ion cooling.

In addition, the computer system 1 contains two arrangements 9. The arrangement 9 connects one electrode to a ground potential 11 and has, for example, a device 12 for the measurement of the voltage drop across a resistor 13, with this voltage being proportional to the current flowing from the electrode.

For determining the current flow from the voltage measured by the device 12, for example, a comparison-evaluation circuit could be included in the arrangement 9. By means of the comparison-evaluation circuit, the voltage values could be read in, converted into current values, and forwarded to a main board for further processing by software of the computer system 1.

In addition to the ion cooling system 7, the computer system 1 can also have a redundant, conventional ventilator cooling by fans. Additional ion coolers provided for the other system components (2, 4, 5) could also be integrated into the computer system 1. In particular, an ion cooler could be provided for the power supply unit 2 of the computer system 1, wherein the ion cooler could be integrated into the power supply unit 2.

The arrangement 9 is designed for the measurement of the charge transferred by the ionized air flow 8 to at least one electrode and thus for the determination of the ionization of the air flow 8. It is attached to the electrodes located in the air flow 8.

In this example, a conductive surface (for example, a cooling body of the system component 6) attached to the system component 6—for example, a graphics card or a sound card—as well as an additional component 10 installed in the air flow 8 are used as electrodes. The use of a conductive surface attached on or in the power supply unit 2 as an electrode for monitoring the charge of the power supply unit 2 for its ion cooling is also possible.

The cooling body typically comprises a heat-conductive metal, such as aluminum or copper, and is used for improving the heat dissipation from heat-generating components, such as, in this case, the system component 6. Here, the cooling body could be fixed to the system component 6 with the help of screws or clamps or else also bonded to the system component 6.

The component 10 can be, for example, a conductive, non-grounded surface. This surface can be shaped in its form like an additional system component (dummy component), which makes measurements of the electrostatic charge of this electrode more realistic for an evaluation of the charge of the system components of the computer system 1. This dummy component is not important for the function of the computer system 1, but delivers significant measurements of the ionization of the air flow 8 and the size of the generated electrostatic charge. Furthermore, any additional cooling body of the system components of the computer system 1 can be used as electrodes, in particular, the CPU cooling body could be used.

Through the measurement of the voltage and the current flow (exiting the electrode) determined in this way, the electrostatic charge of the electrode can be determined and therefore the ionizing effect of the air flow 8 can be dissipated. Likewise, a measurement of the charge transferred to the electrode can also be performed directly, in order to determine the ionization of the air flow 8. This can happen, for example, through an arrangement that contains a capacitor. By transferring the charge of the electrode to the capacitor and subsequent measurement of the voltage drop across the capacitor, in this way the charge can be determined directly—for the known capacitance of the capacitor.

By determining the integrated current flow within a predetermined time and its comparison with a reference value or by a comparison with previously performed measurements of the integrated current flow, the ionization of the air flow 8 can be determined and thus the functionality of the ion cooling system 7 and the cooling function for the computer system 1 can be tested. In this way, error functions can be determined at an early time that are made noticeable by ionization of the air flow 8 that is too strong (or also too weak) and thus by increasing (or decreasing) values for the integrated current flow. In this way, countermeasures against a loss of the CPU 3 due to overloading or, as a result of this, a loss of the computer system 1 can be taken in due time.

The arrangement 9 can also contain a switching element—for example, as shown in this embodiment—by means of which the connection of the component 10 to the ground potential can be established or broken. The switching element in the arrangement 9 can contain transistors or also a thyristor arrangement. A circuit by means of a relay is also imaginable.

The switching element is controlled—as shown schematically in FIG. 1—by the CPU 3 of the computer system 1 in this embodiment, but it is also imaginable that the switching element is controlled internally by a timer also contained in the arrangement 9.

Through the switching element, a detectable signal can be generated even for a slight ionization of the air flow 8 and thus a small charge of the electrodes through a buildup of the electrostatic charge over a long time period and thus the ionization of the air flow 8 can be monitored.

This time period can be set by a predetermined time that should be adapted to the functioning of the cooling system 7 and the degree of ionization of the air flow 8. For this purpose, a timer also contained in the arrangement 9 can be used and after the timer has elapsed, for example, the switching element is switched and thus the connection of the electrode to the ground potential 11 is established and thereupon the measurement of the voltage drop across the resistor 13 is performed. After the connection is broken again, the timer is reset and started again. In this way, the testing of the ionization is possible at regular, specified intervals.

Through a comparison of the measured voltage values and the current flow that is determined from these values and that goes out from the electrode, the functionality of the cooling system can be inferred and continuous monitoring of the ion cooling can be achieved. In this way, interruption-free operation of the computer system 1 is guaranteed.

Figure 3:
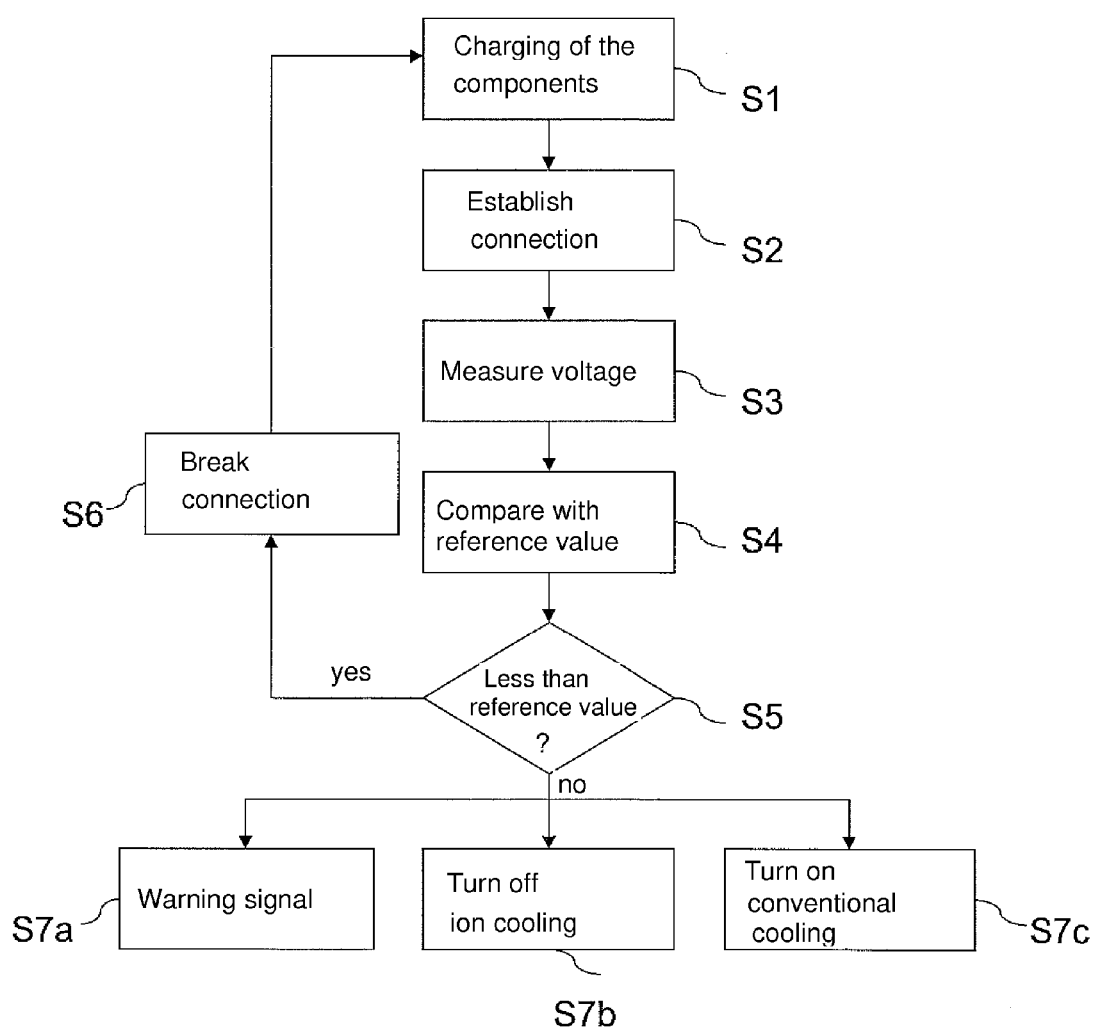

FIG. 3 shows a flow chart for a method for monitoring the electrostatic charge of a component of an electronic device located in an ionized air flow 8.

Step S1 here designates the electrostatic charge caused by the ionized air flow 8 for the component of the device. Here the component can be, for example, an electrode that is installed in the device at a later time and that is constructed like an electronic component of the device. A conductive surface (such as, for example, a cooling body) of each system component also present in the device and located in the air flow 8 is imaginable as an electrode.

In this embodiment, the component is connected to an arrangement 9 that contains a switching element, so that a connection between the component of the device and a ground potential 11 can be broken or established. For only a low ionization of the air flow 8, the connection is broken by the switching element and thus a measurable electrode charge is created that can be defined in a next step.

In step S2, the connection between the component and the ground potential 11 is established by the switching element in arrangement 9. The connection can be established here at specified intervals—for example, by a timer contained in the arrangement 9—as a function of the strength of the ionization of the air flow 8, in order to determine, on one hand, an overload of the component and, on the other hand, however, to generate a measurable signal by an electrostatic charge of the component to be established by means of a defined time period.

In step S3, a measurement of the electrostatic charge of the component is performed. This can take place by determining the current flowing from the component by means of a device 12 contained in an arrangement 9 for the measurement of the voltage drop across a resistor 13, wherein this voltage drop is proportional to the flowing current.

In step S4, the determined value is compared with a specified reference value that should not be critical for the components or the device.

Step S5 contains a query whether the value determined in step S3 is less than the reference value. If yes, then the connection between the component and the ground potential 11 is then broken (step S6) and a new charging of the component by the ionized air flow 8 takes place (step S1).

If the value determined in step S3 for the electrostatic charge of the component is greater than the reference value, a warning signal is output in step S7a.

Furthermore, in this embodiment, as described in step S7b, the ion cooling of the device is turned off and then in step S7c an additional conventional cooling by ventilators, wherein this cooling is redundant in the device, is turned on. The switching must take place so quickly that no overheating of the components of the device due to the interruption in the cooling can take place.

However, just the output of a warning signal (step S7a) is also possible, without also turning off the ion cooling system 7 (step S7b) or switching to a conventional cooling mode (step S7c) having to be performed. A complete shutdown of the device for the exceeding of the reference value is also imaginable.

Through the method, the ionization of the air flow 8 (also in the case of only a low ionization) can be monitored continuously and thus an overloading of the components of the device can be prevented. Therefore, an interruption-free operation of components and the device is guaranteed.

What is claimed is:

1. An electronic device comprising:
   at least one component;
   an ion cooling system for cooling the at least one component; and
   an arrangement that determines an ionization of an air flow caused by the ion cooling system, wherein the arrangement determines a measurement of charge transferred by the ionization to at least one conductive surface of the at least one component or a dummy component located in the air flow of the electronic device.

2. The electronic device according to claim 1, wherein the arrangement determines a current flowing out from the at least one conductive surface to determine the ionization of the air flow.

3. The electronic device according to claim 1, wherein the at least one component is a system component located in the air flow.

4. The electronic device according to claim 3, wherein the at least one conductive surface is a cooling body of the system component.

5. The electronic device according to claim 1, wherein the arrangement comprises a device for determining a current flowing out from the at least one conductive surface, the at least one conductive surface being connected to a ground potential.

6. The electronic device according to claim 5, wherein the device for determining the current comprises a device that measures a voltage drop across a resistor.

7. The electronic device according to claim 6, wherein the voltage drop across the resistor is measured by the device to determine the current flowing from the at least one conductive surface.

8. The electronic device according to claim 1, wherein the arrangement further comprises a switching element configured to connect or disconnect the at least one conductive surface to a ground potential.

9. The electronic device according to claim 8, wherein the switching element comprises a transistor.

10. The electronic device according to claim 8, wherein the switching element comprises thyristors.

11. The electronic device according to claim 8, wherein the switching element comprises a relay.

12. The electronic device according to claim 1, wherein the arrangement comprises a timer that is designed to cause a measurement of a voltage drop across a resistor at repeating intervals.

13. The electronic device according to claim 1, wherein the arrangement is configured to dissipate the charge on the at least one conductive surface generated by the air flow in a controlled way.

14. The electronic device according to claim 1, wherein the electronic device is a computer system.

15. The device according to claim 1, wherein the at least one component is arranged outside the ion cooling system.

16. The device according to claim 1, further comprising a redundant cooling fan that is turned on if the arrangement determines that the ionization of the air flow caused by the ion cooling system exceeds a specified reference value.

17. A method for monitoring the electrostatic charge on at least one component of an electronic device with an ion cooling system, the method comprising:

providing an electronic device that includes an ion cooling system for cooling a component of the electronic device;

measuring electrostatic charge on a conductive surface the component or a dummy component of the electronic device that is located in an ionized air flow;

comparing an ionization of the air flow generated by the ion cooling system with a specified reference value; and performing a preventative step when the reference value is exceeded.

18. The method according to claim 17, wherein performing the preventative step comprises issuing a warning signal.

19. The method according to claim 17, wherein performing the preventative step comprises turning off of the ion cooling system and simultaneously turning on a redundant fan cooling.

20. The method according to claim 17, wherein performing the preventative step comprises turning off the electronic device.

* * * * *